United States Patent [19]

Yext et al.

[11] Patent Number: 4,622,240

[45] Date of Patent: Nov. 11, 1986

[54] PROCESS FOR MANUFACTURING THICK-FILM ELECTRICAL COMPONENTS

[75] Inventors: Walter F. Yext, Allentown; Edward A. Hayduk, Wescosville; Clark K. Fisher, Exton, all of Pa.

[73] Assignee: Air Products and Chemicals, Inc., Allentown, Pa.

[21] Appl. No.: 797,092

[22] Filed: Nov. 12, 1985

[51] Int. Cl.[4] .............................................. H05K 3/12
[52] U.S. Cl. ...................................... 427/96; 427/102; 427/376.2; 427/376.3; 427/377; 427/379; 427/380; 427/383.5
[58] Field of Search .............. 427/96, 377, 102, 383.5, 427/376.2, 376.3, 379, 380

[56] References Cited

U.S. PATENT DOCUMENTS

| | | | |
|---|---|---|---|
| 3,726,006 | 4/1973 | Muckelroy | 29/625 |
| 3,914,514 | 10/1975 | Mackenzie | 427/383.5 |
| 3,914,517 | 10/1975 | Pirodz | 427/383.5 |
| 4,122,232 | 10/1978 | Kuo | 428/323 |
| 4,296,272 | 10/1981 | Schelhorn | 174/68.5 |
| 4,311,730 | 1/1982 | Pedder | 427/102 |
| 4,313,262 | 2/1982 | Barnes et al. | 29/840 |
| 4,409,261 | 10/1983 | Kuo | 427/96 |
| 4,517,155 | 5/1985 | Prakash et al. | 419/19 |
| 4,525,387 | 6/1985 | Ebata | 427/377 |
| 4,540,604 | 9/1985 | Siuta | 427/96 |
| 4,551,357 | 11/1985 | Takeuchi | 427/96 |
| 4,567,111 | 1/1986 | Janikowski | 427/377 |

*Primary Examiner*—John D. Smith
*Attorney, Agent, or Firm*—James C. Simmons; E. Eugene Innis

[57] ABSTRACT

Nitrous oxide additions to the furnace atmosphere during firing of thick film electrical components minimizes soot deposition from vaporization of vehicle contained in the film paste.

12 Claims, 4 Drawing Figures

PROCESS FOR MANUFACTURING THICK-FILM ELECTRICAL COMPONENTS

TECHNICAL FIELD

The present invention pertains to the manufacture of thick-film circuits or electrical networks by applying pastes containing conductive, resistive, dielectric, or any combination of these materials onto a ceramic substrate by means of a screen or a mask followed by drying and firing under atmosphere and elevated temperature to fix the paste to the substrate.

BACKGROUND OF THE PRIOR ART

Various microelectronic circuits are formed by means of thick-film technology which includes the furnace firing of an ink or paste formulated from materials that include a property determinator which will make the printed material either conductive, resistive or dielectric in nature. The paste is formulated using metal powders, a glass frit powder, binders and vehicles and placed or deposited in a selected pattern onto a nonconductive substrate (e.g., ceramic porcelainized steel, glass) printed and then dried to volatilize vehicle constituents contained in the paste such that it can then be fired to sinter or fuse the constituents bonding the film to the substrate.

Precious-metal conductive paste materials are prepared using a noble metal or combination of noble metals such as platinum, palladium, silver, or gold to permit electrical flow with minimal opposition. Resistive materials are pastes which contain a variety of substances such as carbon, thallium, indium, ruthenium, and many others. Dielectrics are prepared by using pastes containing glasses, ceramics, glazes, and ferro-electric materials. Precious-metal conductors, dielectrics, and resistors are typically designed to be compatible with each other and are fired at temperatures between 700°–1000° C. in an air atmosphere.

The use of an oxidizing air atmosphere is ideal for removing carbon-based vehicles whose main purpose is to impart the proper rheological properties during screen printing. In an air-fireable system oxygen is readily available to oxidize any of the organic vehicles that vaporize during the thick-film firing cycle to carbon monoxide (CO), carbon dioxide ($CO_2$), and water vapor ($H_2O$). Gaseous CO, $CO_2$, and $H_2O$ are easily swept from the furnace by the exiting air atmosphere. The presence of an oxidizing atmosphere also serves to maintain the proper physical environment within the thick film, so that the sintering and adhesion mechanisms can occur properly.

In the past, in manufacture of the thick-film conductors, noble metals such as gold, silver, platinum and palladium have been used for conductors. Because of their low cost and better physical properties, attempts have been made to substitute base metals for noble metals. Copper, because of cost and physical properties (solderability and conductivity) is an ideal candidate. Air, previously used as a firing atmosphere, must be replaced by a neutral atmosphere (e.g. nitrogen, argon, helium, or mixtures thereof), to fire copper thick-films, conductors, resistors and dielectrics. Although useful in preventing the copper from oxidizing, a neutral atmosphere - typically nitrogen, does not provide an oxidizing agent capable of removing the carbon-based vehicle in an efficient manner. In the absence of an oxidizing agent the vehicles pyrolyze as the parts are processed.

The addition of oxygen or oxidizers to the nitrogen furnace atmosphere has led to problems since the oxidizer tends to oxidize the base-metal copper creating an adverse change in electrical characteristics and solderability properties because of formation of oxide coatings thereon.

In conventional copper thick-film practice, firing is carried out in a belt furnace having an atmosphere which is basically inert, but which contains small amounts of oxidizing agents (typically oxygen or air) to react with the vehicle and oxidize the components of the vehicle that are made from carbon-based constituents. The atmosphere is moved through the furnace to sweep the reactive products from the furnace. In the prior art of copper thick-film processes, the carbon-based vehicles do not react efficiently with the small amount of oxygen added to the nitrogen atmosphere and tend to form free carbon in the form of soot which can deposit on heating elements, on walls in the furnace as well as on the substrates being treated. Free carbon can cause defects in the electrical component, especially if it deposits between alternate layers of a multi-layer structure. Carbon deposited on the walls of the furnace must periodically be removed, thus adding to the cost of the operation. Single layer thick-film electrical components containing deposited carbon must be cleaned adding another step and additional cost to the production of such devices.

Attempts have been made to solve the problem by means of controlling the atmosphere by limiting the oxygen content as shown in U.S. Pat. Nos. 3,726,006; 4,296,272; 4,311,730; 4,313,262 and 4,517,155. The foregoing patents all show the use of oxygen to oxidize the volatilized constituents of the vehicle to remove them from the furnace or the use of oxygen to provide a resistor by oxidizing the material deposited on the substrate.

Other attempts to solve the problem by means of atmospheric control or control of the composition of the printing ink are shown in U.S. Pat. Nos. 4,409,261 and 4,122,232.

In addition to the use of oxygen additions to the preheat zone of a multi-zone furnace used to process thick-film electrical components and the altering of the paste formulations, other solutions have been proposed which center around modifying the furnace design to assist in removal of the volatilized vehicle from the printing ink, processing the parts in air using sacrificial iron containers to getter excess oxygen and to increase atmosphere flow rates into the furnace. Tien-Shou Wo et al., in their article describe a process by which parts are fired in air using sacrificial iron containers to preferentially react with excess oxygen. The continued use of large gas flow rates to physically sweep the carbon level vehicles out of the furnace is evidence that the above attempts have not solved the basic problem.

Furnace modifications have been made in attempts to evacuate the vehicle from the preheat zone more effectively. By introducing a greater volume of inert gas and designing several vent stacks into the preheat zone, the vehicles are swept from this area only to redeposit on the cooler vent stacks. This depositional process continues thus making it necessary to clean the vent stacks frequently or have partially decomposed carbon-based material drip onto the parts in the furnace.

SUMMARY OF THE INVENTION

It has been discovered that during the firing of base-metal thick-film electrical components made by conventional printing ink technology that if controlled amounts of nitrous oxide are added to an inert furnace atmosphere containing substantially nitrogen with incidental amounts of oxygen from the atmosphere and incidental amounts of water vapor accumulated through the piping used to conduct the nitrogen to the furnace, that not only will an oxidizing species of sufficient oxidizing potential be available to react with the vaporized vehicle, but that soot formation will be suppressed, if not eliminated, in the production furnace.

Furthermore, it has been discovered that, if a single zone furnace is used to fire the thick-film electrical component, an addition of between 10 and 3,000 parts per million nitrous oxide to the furnace will not produce an undesirable oxide level if a base metal is used to form the electrical component while suppressing soot formation during oxidation of the vehicle. Controlled addition of water vapor beyond that normally present in the furnace can provide improved conductor solderability. A batch or continuous belt furnace, heated by infrared radiation or conventional means can be used to practice the invention. If, on the other hand, a multi-zone furnace is used which includes a preheat zone, addition of from 10 to 10,000 ppm nitrous oxide ($N_2O$) in the preheat zone will achieve the same effect. Addition of a lower concentration (10–3000 ppm) of $N_2O$ can be made to the hot zone to utilize the higher temperature to oxidize any carbonaceous materials that are not oxidized in the preheat zone. When nitrous oxide is controllably added to the preheat or the hot zone, water at concentrations between 10 to 2500 parts per million can be added to the hot zone in order to improve the copper conductors solderability property.

BRIEF DESCRIPTION OF THE DRAWING

FIG. 4 is a photograph of the sides of a series of substrates comparing substrate processed in accordance with the prior art untreated substrates, and substrates processed in accordance with the present invention.

DESCRIPTION OF THE PREFERRED EMBODIMENTS

Figure 1:
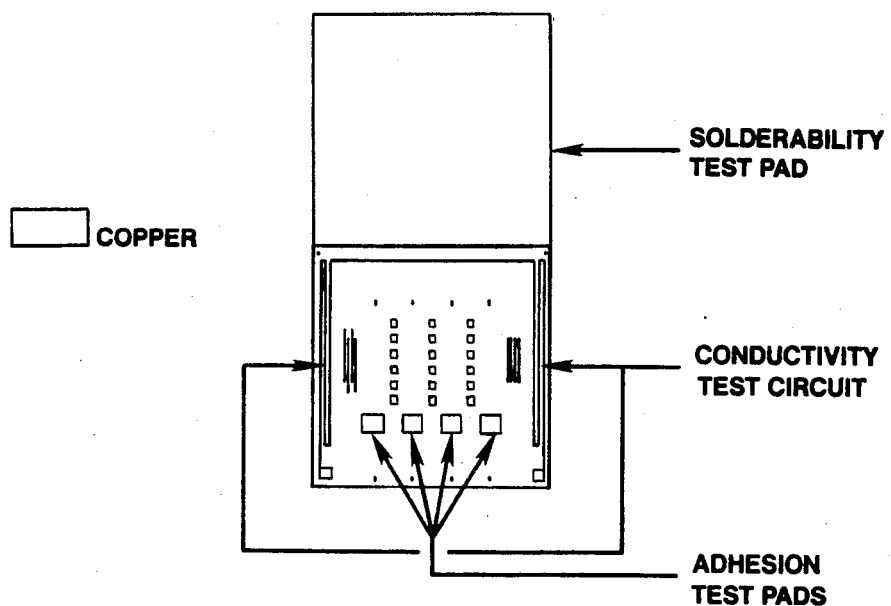
FIG. 1 is a schematic representation of a test substrate coated with a thick-film copper conductor paste printed on an alumina substrate.

As set out above, conventional thick-film technology is used to form electrical networks by applying a paste coating through a screen or mask in a selective pattern onto a ceramic substrate. After drying, the ceramic substrate is fired in a furnace containing a protective atmosphere. Depending upon the composition of the paste, the material deposited on the ceramic substrate can be conductive, resistive or dielectric in nature. Conductive material is usually formulated by using a noble metal (e.g., platinum, palladium, silver or gold) paste to permit electrical flow with minimum opposition. In view of the cost of noble or precious metals, some base-metal conductors, such as copper, are beginning to gain acceptance in the business. Resistive materials are composed of pastes which contain a variety of substances such as carbon, thallium, indium, ruthenium and many others. Resistors are used to block the flow of electrical current at a given level and are usually printed onto the ceramic substrate after the conductor has been printed onto the substrate and fired, thus, providing a multi-layer device. The desired level of resistance is achieved by laser trimming or air abrasive trimming after firing of the resistive coating on the substrate. Dielectrics are achieved by using pastes containing glasses, glazes and ferro-electric materials which serve as electrical insulators to prohibit the flow of electrical current. The range of insulation can be varied widely depending upon the particular application with dielectrics being used to permit conductors to cross over top of one another by placing a dielectric insulating layer between the two conductors. Dielectrics are also used to build capacitors and multi-layer circuits and can be used as over-glazes to hermetically seal the entire circuitry to the ceramic substrate.

In the processing of large volumes of dielectric thick-film paste in a continuous belt furnace under an inert atmosphere (e.g., nitrogen), the atmosphere becomes saturated with vaporized carbon-based vehicle which is used to make the paste. The vehicle is necessary so the paste can be made to flow through the screen and adhere to the substrate prior to firing. Carbon-based vehicles and polymer binders are used in the ink. As the carbon-based polymer volatilizes, any oxygen contained in the furnace atmosphere would be used to convert the polymer to products of reaction, such as carbon monoxide and carbon dioxide which then can be swept from the furnace by the base atmosphere of nitrogen. However, saturation of the furnace atmosphere can cause carbon in the form of soot to deposit on various parts of the furnace (e.g. walls, heating elements) and the electrical component being fired. Deposits formed on the furnace must be removed since they can be transferred by the furnace atmosphere and deposited on to other parts of the furnace or the material being treated. Soot deposits on heating elements in the furnace will affect the overall ability of the furnace to reach and maintain a uniform temperature. Soot on the walls of the furnace can cause various problems, such as hot spots or localized temperature variation, in the furnace. Soot deposits on the substrates create an unacceptable appearance of the substrate and often a defective circuit, especially if soot is deposited between the layers as they are built up on a multi-layer thick-film circuit. In current copper thick-film practice, high atmosphere flow rates are used in the firing furnace to sweep the vaporized vehicle from the furnace and eliminate soot deposits.

In the production of a thick-film conductor, since the industry has elected to replace precious-metal conductors with copper conductors, a problem arises in that the vehicles used to impart the proper rheological properties to the thick-film inks deposited in the furnace after they vaporize. Precious-metal conductors can be fired in a furnace atmosphere which is entirely air. However, copper conductors must be fired in an inert atmosphere to prevent oxidation of copper. Usually, the inert atmosphere contains insufficient oxygen to effectively oxidize the carbon-based vehicles so they pyrolyze and cause sooting problems in the furnace and on the parts. Polymers that condense on the furnace walls make it necessary to clean the furnace on a regular basis to prevent deposits from dripping on to the belt and the parts being processed. This involves complete cooling down of the furnace and mechanical removal of the soot, thus diminishing available production time. If the soot and condensed polymers deposit onto the surface of the copper conductor and the ceramic substrate, they create an aesthetlcally undesirable substrate and can compromise the quality of later processing steps such as wire bonding or soldering, as well as causing defects between layers of a multi-layer electrical component. Therefore, it is necessary to clean the substrates before further processing, thus adding to the cost of the substrate. It has been proposed to add small amounts of oxygen (up to 1%, normally 10–15 ppm) to the preheat zone of a multi-zone furnace. At the low temperature and short residence time in the preheat zone, the oxygen will not oxidize the copper to an unacceptable level, but can oxidize some of the carbon-based vehicles. This technique is not completely effective, presumably because of the low temperatures in which reactants are present. An unacceptable level of oxidization of the copper could also occur should oxygen migrate into hotter areas of the furnace, thus ruining a conductive electrical component.

Furnace modifications have been made in attempts to evacuate the vehicle from the preheat zone more effectively. By introducing a greater volume of inert gas and designing several vent stacks into the preheat zone, the vehicles are swept from this area only to redeposit on the cooler vent stacks. This depositional process continues making it necessary to clean the vent stacks frequently or have partially decomposed carbon-based material drip onto the parts.

Processing parts in an air atmosphere using a sacrificial iron container that preferentially oxidizes before the copper is often uneconomical, and the physical properties of the copper are probably not optimized due to small amount of oxygen available near the surface to react with and remove the organic vehicles.

Little success to date has been obtained in attempts to modify base-metal paste formulations to eliminate the sooting problem.

It has been discovered that adding low levels of nitrous oxide to the firing furnace can suppress the formation of soot and/or the oxidation of the conductive material such as copper during the production of thick-film components. A level of between 10 and 3,000 parts per million (ppm) of nitrous oxide throughout a single zone furnace is effective to volatilize and react with the vehicle from the thick-film while suppressing oxide formation on the copper thick-films laid down on the substrate. Controlled additions of water vapor beyond that normally present in the furnace can provide improved conductor solderability. This is the result whether or not nitrous oxide is used in the furnace atmosphere. The nitrous oxide reacts directly or indirectly with the vehicle to produce carbon monoxide and carbon dioxide which can be easily swept from the furnace by the conventional furnace atmosphere. The level of nitrous oxide necessary to react completely with the vehicle does not negatively affect the paste composition laid down on the substrate maintaining desirable levels of the conductive, resistive or dielectric properties of the finished electrical component. If the nitrous oxide is added to the preheat zone of a multi-zone furnace, then an injection rate to maintain between 10 and 10,000 ppm nitrous oxide in the preheat zone is required. When nitrous oxide is added to the preheat or hot zone of the furnace, water at concentrations of between 10 and 2500 parts per million can be added to the hot zone in order to improve the copper conductors' solderability.

In the present invention, the thick-film component (conductor, dielectric, and resistors) is formed on the substrate in the conventional manner, and then the parts are processed in batch or a belt furnace. In a belt furnace, the temperature is maintained between 300° and 1,000° C. in the hot zone of a multi-zone furnace where the substrates are held between 3 and 15 minutes to achieve the firing. With a preheat and cooldown in a continuous process, the entire process of firing can take between 5 and 60 minutes depending upon whether an infra-red or a conventional furnace is used.

During the initial heating, or vehicle "burnout" stage, the copper thick-film circuit is subjected to temperatures up to 400° C. for between one and fifteen minutes depending on which type of heating source is used. It is at this time that the majority of the organic vehicle is essentially removed from the copper paste. Therefore, in the present invention controlled amounts of nitrous oxide, preferably from 10 to 3,000 ppm if added to the hot zone and 10–10,000 ppm if added to the preheat is provided in the nitrogen atmosphere to react with the carbonaceous vehicles as they vaporize from the paste. Continued heating of the parts to temperatures up to 1,000° C. melts the glass binder in the paste providing adherence to the substrate and sinters the copper particles. The following examples will illustrate the present invention.

EXAMPLE 1

Figure 2:
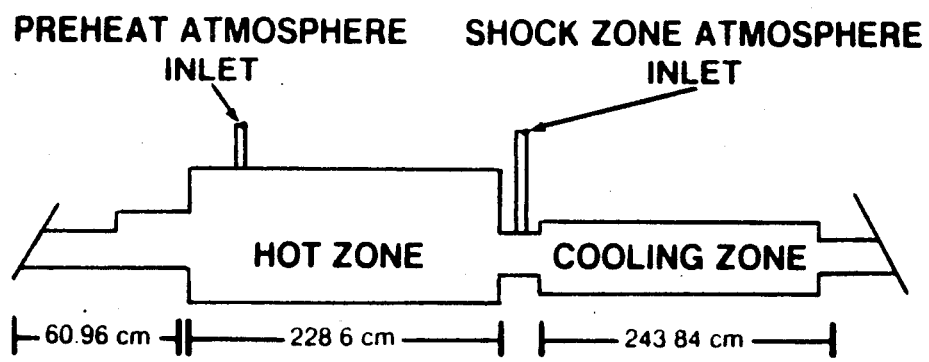
FIG. 2 is a schematic representation of a furnace and the plot of time against temperature for the firing of the substrate of FIG. 1.
Figure 2:
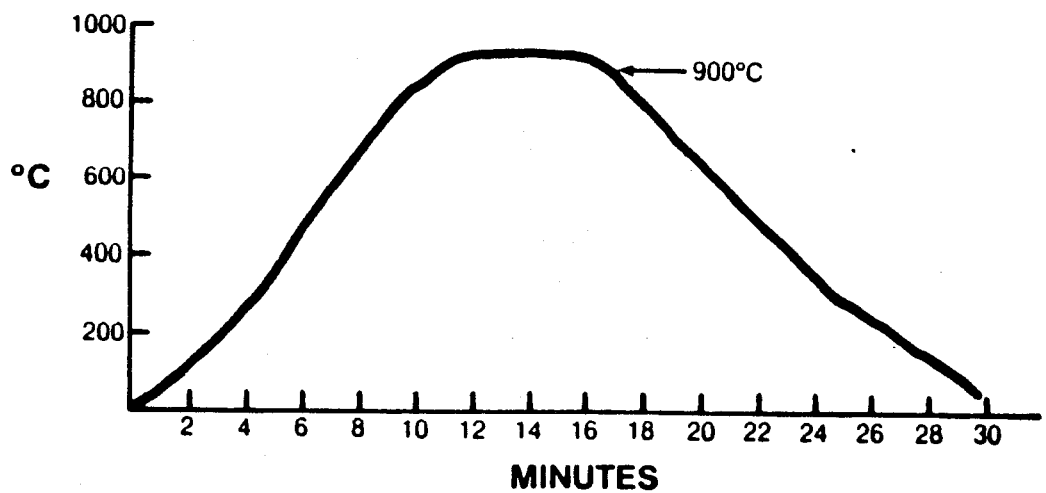

Commercially available copper thick-film conductor pastes were printed and dried in a conventional manner known to the industry. The test pattern shown in FIG. 1 was printed on 1"×2" Coors 94–96% alumina substrates and fired in a conventional belt furnace according to the heating profile in FIG. 2. Electrical and physical properties for copper conductors fired with nitrous oxide additions to the nitrogen atmosphere are given in Table I.

TABLE I

COPPER THICK-FILM CONDUCTOR TEST

| | | |
|---|---|---|
| 1. | Furnace Temperature | 900° C. |
| | Time @ 900° C. | 6 minutes |
| | Sample | Ceramic substrate with thick-film copper conductor |
| | Atmosphere | 250 ppm $N_2O$ (throughout furnace) |
| | | −60° dew point (d.p.) (10 ppm $H_2O$) |
| | | 1 ppm oxygen |
| | | Balance nitrogen |
| | Physical Test Results | |
| | Sheet Resistivity | 1.98 milliohms/square |
| | Initial Adhesion | 953 psi |
| | Aged Adhesion | 828 psi |
| | Solderability Force Change | .45 millinewtons/millimeter |
| | No carbon residue present on the processed parts | |
| 2. | Furnace Temperature | 900° C. |
| | Time @ 900° C. | 6 minutes |
| | Sample | Ceramic substrate with thick-film copper conductor |
| | Atmosphere | 1000 ppm $N_2O$ (preheat zone of furnace) |
| | | −65° dew point (d.p.) (10 ppm $H_2O$) |
| | | 1 ppm $O_2$ |
| | | Balance nitrogen |
| | Physical Test Results | |
| | Sheet Resistivity | 1.79 milliohms/square |
| | Initial Adhesion | 1141 psi |
| | Aged Adhesion | 938 psi |

TABLE I-continued
COPPER THICK-FILM CONDUCTOR TEST

| | |
|---|---|
| Solderability Force Change | .45 millinewtons/millimeter |
| No carbon residue present on the processed parts | |

From Table I, it is apparent that the addition of nitrous oxide present at a first level throughout the furnace or at a higher level in the preheat zone of the furnace serves to produce a copper thick-film conductor with acceptable properties. It is well known in the trade that an initial adhesion level of 650 psi, and a solderability value of 0.4 milli-newtons/millimeter define acceptable thick-film conductor properties for the test procedures used.

When nitrous oxide is added to the preheat zone, controlled amounts of water can be added to the hot zone resulting in a fired copper conductor with superior solderability. Set forth in Table IA is data supporting this phenomena.

TABLE IA
COPPER THICK-FILM CONDUCTOR TEST

| 1. | Furnace Temperature | 900° C. |
|---|---|---|
| | Time @ 900° C. | 6 minutes |
| | Sample | Ceramic substrate with thick-film copper conductor |
| | Atmosphere | 1000 ppm N$_2$O (preheat Zone of furnace) |
| | | 159 ppm H$_2$O (hot Zone of furnace) |
| | | 1 ppm O$_2$ |
| | | balance N$_2$ |
| | Physical Test Results | |
| | Sheet Resistivity | 1.74 milliohm/square |
| | Initial Adhesion | 1109 psi |
| | Aged Adhesion | 656 psi |
| | Solderability Force Change | .52 millinewtons/millimeter |
| | No carbon residue present on the processed parts | |

EXAMPLE II

Commercially available, copper compatible thick-film dielectric pastes were printed and dried in a conventional manner known to the industry. The test pattern shown in FIG. 3 was printed on 1"×2" Coors alumina substrates. The test parts were fired in a furnace containing large numbers of 2"×2" substrates coated with dielectric paste to a dried thickness of 50 micrometers. This situation represented the worst possible case for vehicle removal as 82% of the belt surface area was covered by dielectric. When this large volume of dielectric ink was processed in a standard nitrogen atmosphere containing 6 ppm of oxygen, an unacceptable amount of sooting occurred in all substrates processed as well as large carbon deposits on the dielectric. The fired dielectric prints were grey, indicating inadequate removal of the vehicle. Set forth in Table II are two furnace runs showing the production of thick-film dielectric electrical components utilizing a nitrous oxide addition to the furnace.

TABLE II
THICK-FILM DIELECTRIC TEST

| 1. | Furnace Temperature | 900° C. |
|---|---|---|
| | Time @ 900° C. | 6 minutes |
| | Sample | 2" by 2" by .025" ceramic substrate with 82% of surface covered with 2 dried thick-film dielectric layers, a total 50 microns thick |
| | Atmosphere | 1500 ppm N$_2$O (throughout furnace) |
| | | −46° C. d.p. (90 ppm H$_2$O) |
| | | 15 ppm O$_2$ |
| | | Balance N$_2$ |
| | Physical Test Results | |
| | Dielectric Constant | 7.58 |
| | Dissipation Factor | .54 |
| | No carbon residue present on the processed parts. | |
| 2. | Furnace Temperature | 900° C. |
| | Time @ 900° C. | 6 minutes |
| | Sample | 2" by 2" by .025" ceramic substrate with 82% of surface covered with 2 dried thick-film dielectric layers, a total 50 microns thick |
| | Atmosphere | 100 ppm N$_2$O (throughout furnace) |
| | | −47° C. d.p. (85 ppm H$_2$O) |
| | | 5 ppm O$_2$ |
| | | Balance N$_2$ |
| | Physical Test Results | |
| | Dielectric Constant | 7.46 |
| | Dissipation Factor | 0.37 |
| | No carbon residue present on the processed parts. | |

From the data presented in Table II it is apparent that the use of nitrous oxide additions to the furnace atmosphere produce copper compatible thick-film dielectrics with acceptable dielectric constants and dissipation factors while at the same time eliminating the sooting problem. It is well known in the industry that a dielectric constant of 7.5 and a dissipation factor of about 0.5% or less define acceptable thick-film dielectrics. A visual indication of the ability of nitrous oxide additions to the atmosphere to eliminate sooting is given in FIG. 4.

EXAMPLE III

Set forth in Table III are results from a series of tests wherein a thick-film copper conductor on a ceramic substrate was produced under various furnace atmospheres. These tests were performed in order to demonstrate that direct additions of oxygen using either air or pure oxygen cannot achieve physical properties as good as those obtained using nitrous oxide additions.

TABLE III
COPPER CONDUCTOR PHYSICAL PROPERTIES

| Test | Atmosphere Composition | Resistance Milliohms/Sq. | Initial Adhesion psi | Solderability Test millinewtons/mm |
|---|---|---|---|---|
| 1 | 30 ppm H$_2$O<br>12 ppm O$_2$<br>100 ppm N$_2$O<br>Balance N$_2$ | 2.85 | 672 | 0.42 |
| 2 | 18 ppm H$_2$O<br>13 ppm O$_2$<br>Balance N$_2$ | 3.23 | 547 | 0.46 |
| 3 | 23 ppm H$_2$O<br>17 ppm O$_2$<br>500 ppm N$_2$O<br>Balance N$_2$ | 3.26 | 719 | 0.44 |
| 4 | 20 ppm H$_2$O<br>17 ppm O$_2$<br>Balance N$_2$ | 3.59 | 547 | 0 |
| 5 | 22 ppm H$_2$O<br>35 ppm O$_2$<br>1000 ppm N$_2$O<br>Balance N$_2$ | 5.26 | 614 | 0.38 |
| 6 | 20 ppm H$_2$O<br>35 ppm O$_2$<br>Balance N$_2$ | 3.34 | 438 | 0 |

In Table III, the value resistance is measured in milliohms/sq. This indicates the ability of the copper thick-film to conduct electricity. An acceptable resistance for this particular paste would be approximately 3 milli ohms/square. The lower the resistance, the better the conductor. The value of initial adhesion is measured in pounds per square inch, which indicates the ability of the copper to remain attached to the ceramic substrate. A minimum of 650 psi is required with the higher levels indicating better adhesion. The solderability test is measured in millinewtons per millimeter. The solderability tests measure the wetting ability of the copper toward the solder under normal soldering conditions with an acceptable value being 0.4 milli newtons/millimeter, again a higher value indicating better soldering properties. The data in Table III is presented to show that in the runs numbered 1 through 4, a level of oxygen in the atmosphere of 13 ppm or less indicates a base case wherein there is no additional oxygen added to the furnace. The oxygen present is from that normally entrained into the furnace by leakage or with the inert atmosphere composition. The water level of each atmosphere is that normally contained in the furnace by virtue of the introduction of the inert atmosphere which brings with it moisture in the form of a measurable dewpoint in the furnace. Above approximately 13 ppm oxygen indicates there was an intentional addition of oxygen to the furnace, either added as gaseous oxygen or via nitrous oxide to increase the oxygen content as shown in Runs 3 and 4. Run 1 contained a low nitrous oxide addition while maintaining the same oxygen level as Run 2. From the results of Table III, it is apparent that the use of nitrous oxide provides a sufficient oxidation potential to the furnace to produce thick-film electrical components that exhibited acceptable properties in regard to resistance initial adhesion and solderabilty. The use of oxygen additions to the furnace to produce free oxygen levels comparable to those observed when nitrous oxide was used as an oxidant increased the resistivity of the finished parts while decreasing the initial adhesion and decreasing the solderabilty factor. Run 3 contained a higher nitrous oxide addition than Run 1. Run 4 needed oxygen additions to obtain an atmosphere composition equivalent to Run 3. Comparison of the physical properties from Run 3 and 4 demonstrate again that parts processed in atmospheres containing nitrous oxide additions result in better physical properties than those produced by processing in atmospheres using elemental oxygen as an oxidizing agent. This dissimilarity of resultant physical properties clearly demonstrates the benefit of using nitrous oxide as an oxidant over oxygen. In none of the runs where nitrous oxide was used was there any evidence of soot deposited on the furnace or the substrate or was there any visible indication of oxidation of the copper in the deposited film. Runs 5 and 6 show an intentional addition of oxygen to the furnace, wherein temperature and belt speed were the same as for runs 1–4, can affect the properties of the parts to the point where they are unacceptable. If a furnace condition was encountered where large quantities of oxygen were unavoidable, the operating parameter of the furnace (e.g., temperature, belt speed loading) could be adjusted to provide acceptable parts when nitrous oxide is added at this level to the furnace atmosphere.

Processing thick-film electrical components according to the present invention will benefit the user by increasing production capacity by diminishing furnace downtime since furnace cleaning is no longer required. The electronic ceramic circuits produced are clean thus eliminating the need for further cleaning steps while decreasing the number of rejected parts that result from soot deposition on the ceramic or the deposited film. The process of the present invention eliminates the need for extensive furnace modification while minimizing the total furnace atmosphere flow necessary to fire the thick-film circuits.

Furthermore, the process of the invention allows sufficient levels of an oxidizing species such as nitrous oxide to be present at various locations throughout the furnace. When injected throughout the furnace, the nitrous oxide atmosphere utilizes the higher temperature present in the hot zone of a single zone furnace or the hot zone of a multi-zone furnace to more completely oxidize the carbon-based vehicles volatilized during the heating of the parts. If a multi-zone furnace is used, nitrous oxide in the preheat zone can be increased to more completely react with the carbon-based vehicles without degrading properties of the finished part. Nitrous oxide eliminates the sooting problem, encountered with other oxidizing components, without negatively affecting the physical properties of the finished part. Additional benefits can be gained using nitrous oxide in combination with controlled amounts of water to improve base-metal thick-film solderability.

Having thus described our invention, what is desired to be secured by Letters Patent of the United States is set forth in the appended claims.

1. In a process of manufacturing thick-film electrical component by forming a paste suitable for application to a ceramic substrate, applying said paste to said substrate by a conventional screen printing technique, drying said printed substrate and firing said substrate and said paste at elevated temperatures to form said electrical component, the improvement comprising:

firing said paste and substrate composite in a furnace hot zone maintained at a temperature of between 300° and 1000° C. under an atmosphere of gaseous nitrogen to which is added from 10 to 10,000 ppm nitrous oxide.

2. A process according to claim 1 wherein a multi-zone furnace is used and said nitrous oxide is maintained throughout said furnace at a level of between 10 and 3,000 ppm.

3. A process according to claim 1 wherein said furnace has a preheat zone maintained at a temperature of from 22° C. to 850° C. and a hot zone maintained at a temperature of from 300° C. to 1000° C.

4. A process according to claim 3 wherein nitrous oxide is injected into said furnace so that the nitrous oxide is present in the preheat zone of said furnace in an amount between 10 and 10,000 ppm and up to 3000 ppm in said hot zone.

5. A process according to claim 3 wherein nitrous oxide is injected into the preheat zone of said furnace to a maximum of 10,000 ppm in said furnace atmosphere.

6. A process according to claim 5 wherein water is injected into said hot zone to provide water vapor in said atmosphere at a level below 2500 ppm.

7. A process according to claim 1 wherein said thick-film electrical component is a resistor.

8. A process according to claim 1 wherein said thick-film electrical component is conductor.

9. A process according to claim 1 wherein said thick-film electrical component is dielectric.

10. A process according to claim 1 wherein said thick-film electrical composite is formed from a paste containing a noble metal selected from the group consisting essentially of gold, silver, platinum, palladium, ruthenium or mixtures thereof.

11. A process according to claim 1 wherein said thick-film electrical component is formed from a paste containing a base metal.

12. A process according to claim 10 wherein said base metal is copper.

* * * * *

UNITED STATES PATENT AND TRADEMARK OFFICE
CERTIFICATE OF CORRECTION

Figure 3:
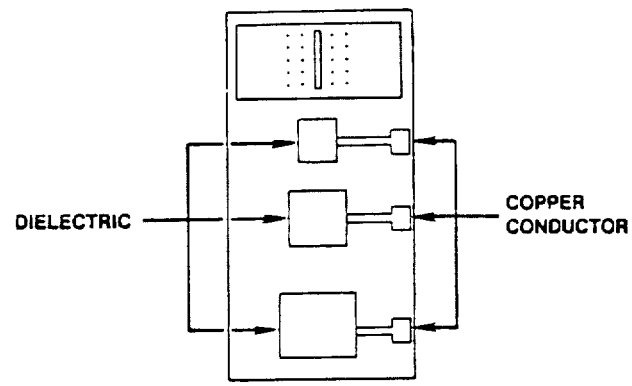
FIG. 3 is a schematic representation of a test substrate coated with a thick-film dielectric paste printed on a alumina substrate.
Figure 3:
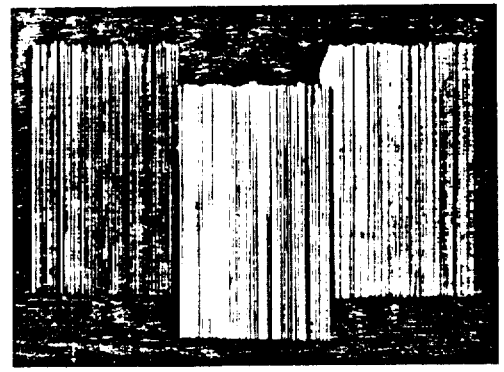

PATENT NO.  : 4,622,240
DATED       : November 11, 1986
INVENTOR(S) : Walter F. Yext, et al It is certified that error appears in the above-identified patent and that said Letters Patent is hereby corrected as shown below:

Insert Figures 3 and 4 as shown on the attached sheet.

Signed and Sealed this

Twenty-fourth Day of May, 1988

Attest:

DONALD J. QUIGG

Attesting Officer

Commissioner of Patents and Trademarks

DIELECTRIC

COPPER CONDUCTOR

Fig 4 A   Fig 4 B   Fig 4 C
*PRIOR ART*

A. PROCESSED IN 6 ppm $O_2$, 63 ppm $H_2O$, BALANCE NITROGEN
B. AS RECEIVED CERAMIC SUBSTRATES
C. PROCESSED IN 1000 ppm $N_2O$, 1 ppm $O_2$, 10 ppm $H_2O$, BALANCE NITROGEN